United States Patent
Ito et al.

(10) Patent No.: US 12,349,279 B2
(45) Date of Patent: Jul. 1, 2025

(54) ELECTRONIC DEVICE

(71) Applicant: DENSO CORPORATION, Kariya (JP)

(72) Inventors: Keitaro Ito, Kariya (JP); Teruhisa Akashi, Kariya (JP); Hideki Terasawa, Kariya (JP); Suguru Houchi, Kariya (JP); Naoki Yoshida, Kariya (JP)

(73) Assignee: DENSO CORPORATION, Kariya (JP)

(*) Notice: Subject to any disclaimer, the term of this patent is extended or adjusted under 35 U.S.C. 154(b) by 177 days.

(21) Appl. No.: 17/878,319

(22) Filed: Aug. 1, 2022

(65) Prior Publication Data

US 2022/0369463 A1 Nov. 17, 2022

Related U.S. Application Data

(63) Continuation of application No. PCT/JP2021/003999, filed on Feb. 3, 2021.

(30) Foreign Application Priority Data

Feb. 4, 2020 (JP) .................................. 2020-017158

(51) Int. Cl.
*H05K 1/18* (2006.01)

(52) U.S. Cl.
CPC ... *H05K 1/181* (2013.01); *H05K 2201/10151* (2013.01)

(58) Field of Classification Search
CPC ......... H05K 1/181; H05K 2201/10151; H05K 2201/10977; H05K 3/3431; G01C 19/5783
See application file for complete search history.

(56) References Cited

U.S. PATENT DOCUMENTS

| | | | |
|---|---|---|---|
| 6,437,450 B1 | 8/2002 | Baba et al. | |
| 2002/0164837 A1 | 11/2002 | Baba et al. | |
| 2012/0111617 A1* | 5/2012 | Motomura | H01L 24/81 174/257 |
| 2014/0231492 A1 | 8/2014 | Saeki et al. | |
| 2016/0205785 A1* | 7/2016 | Kieslinger | H05K 1/181 361/767 |
| 2017/0294413 A1* | 10/2017 | Shi | H01L 25/105 |
| 2018/0269122 A1 | 9/2018 | Kato et al. | |
| 2019/0304878 A1* | 10/2019 | Yamamoto | H01L 23/147 |

FOREIGN PATENT DOCUMENTS

| | | | | |
|---|---|---|---|---|
| JP | 2007035692 A | * | 2/2007 | ... H01L 2224/16225 |
| JP | 2013-102167 A | | 5/2013 | |
| JP | 2015210161 A | * | 11/2015 | |

* cited by examiner

*Primary Examiner* — Abhishek M Rathod
*Assistant Examiner* — Keon Kim
(74) *Attorney, Agent, or Firm* — POSZ LAW GROUP, PLC

(57) ABSTRACT

An electronic device includes a mounting member having a surface, an electronic component, a solder and a sidefill. The electronic component has a plurality of electrodes on a surface and is mounted on the surface of the mounting member so that the surface of the electronic component having the electrodes faces the surface of the mounting member. The solder is disposed between the mounting member and at least one of the electrodes of the electronic component to electrically and mechanically connect between the at least one of the electrodes and the mounting member. The sidefill is disposed on a periphery of the solder and mechanically connects between the electronic component and the mounting member.

6 Claims, 7 Drawing Sheets

ELECTRONIC DEVICE

CROSS REFERENCE TO RELATED APPLICATIONS

The present application is a continuation application of International Patent Application No. PCT/JP2021/003999 filed on Feb. 3, 2021, which designated the U.S. and claims the benefit of priority from Japanese Patent Application No. 2020-017158 filed on Feb. 4, 2020. The entire disclosures of all of the above applications are incorporated herein by reference.

TECHNICAL FIELD

The present disclosure relates to an electronic device in which an electronic component is mounted on a mounting member via a solder.

BACKGROUND

For example, there is an electronic device in which an electronic component is mounted on a mounting member via a solder. The mounting member is a member for having the electronic component thereon, and is, for example, a printed board or the like. The electronic component, for example, has a rectangular parallelepiped outer shape. The electronic component is, for example, a quad flat non-leaded package (QFN) having a plurality of electrodes on a back surface side. The electronic component is electrically connected to the mounting member as the electrodes are connected via the solder.

In such an electronic device, it has been proposed to arrange a sidefill on a periphery of the solder so as to mechanically connect between the electronic component and the mounting member. The sidefill reduces the stress applied to the solder, and contributes to extend the life of the solder.

SUMMARY

The present disclosure describes an electronic device that includes a mounting member, an electronic component, a solder and a sidefill. The electronic component has a plurality of electrodes on a surface and is mounted on a surface of the mounting member so that the surface of the electronic component having the electrodes faces the surface of the mounting member. The solder is disposed between the mounting member and at least one of the electrodes so as to electrically and mechanically connect between the mounting member and the at least one of the electrodes. The sidefill is disposed on a periphery of the solder so as to mechanically connect between the mounting member and the electronic component.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
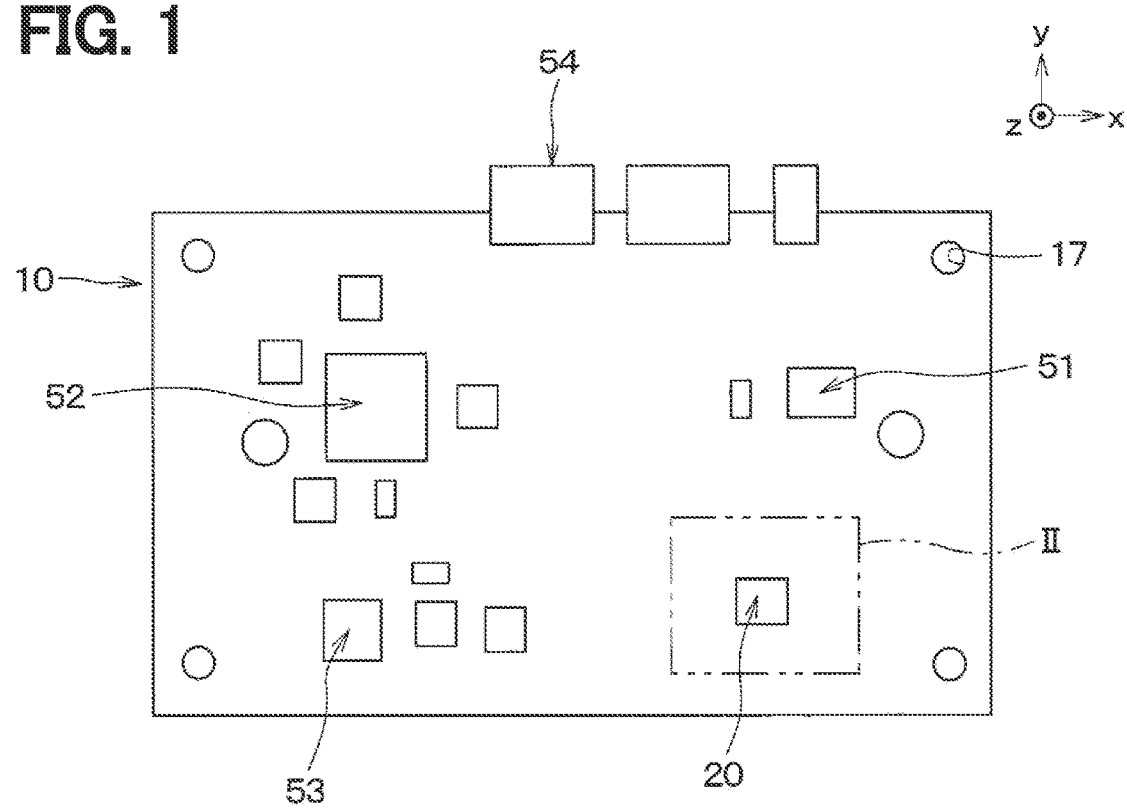
FIG. 1 is a plan view of an electronic device according to a first embodiment.

In an electronic device using a sidefill, the sidefill may be arranged so as to cover the corners of an electronic component mounted on a mounting member with respect to a normal direction to the surface of the mounting member.

If the sidefill is arranged so as to cover the corners of the electronic component opposite to the mounting member, the stress generated on the corners of the electronic component due to the sidefill tends to increase. As a result, a moment generated in the electronic component is likely to increase, causing a defect in the electronic component.

The present disclosure provides an electronic device capable of suppressing an occurrence of a defect.

According to an aspect of the present disclosure, an electronic device includes: a mounting member that has a surface; an electronic component that has a rectangular parallelepiped outer shape, includes a plurality of electrodes on a surface, and is mounted on the surface of the mounting member so that the surface of the electronic component having the electrodes faces the surface of the mounting member; a solder that is disposed between the mounting member and at least one of the electrodes so as to electrically and mechanically connect between the mounting member and the at least one of the electrodes; and a sidefill that is disposed on a periphery of the solder so as to mechanically connect between the electronic component and the mounting member. The sidefill is arranged so as to expose a corner of the electronic component, the corner being on an opposite side to the mounting member.

According to such a configuration, it is possible to suppress an increase in the stress generated at the corner of the electronic component due to the sidefill and thus suppress an increase in the moment generated on the electronic component, as compared with a configuration in which the corners of the electronic component opposite to the mounting member are covered with the sidefill. As such, it is possible to suppress an occurrence of a defect in the electronic component.

Embodiments of the present disclosure will be hereinafter described with reference to the drawings. In the embodiments described hereinafter, the same or equivalent parts are designated with the same reference numerals.

First Embodiment

An electronic device of the first embodiment will be described with reference to the drawings. In the present embodiment described herein, an electronic device provides a self-position estimation system which includes a global navigation satellite system (GNSS) and an inertial measurement unit (IMU). For example, the electronic device of the present embodiment may be mounted on a vehicle, which is equipped with a driving support device. The driving support device may support driving of the vehicle at level three or higher of autonomous driving level defined by the Japanese government or the National Highway Traffic Safety Administration (NHTSA) of the United States of America.

Figure 2:
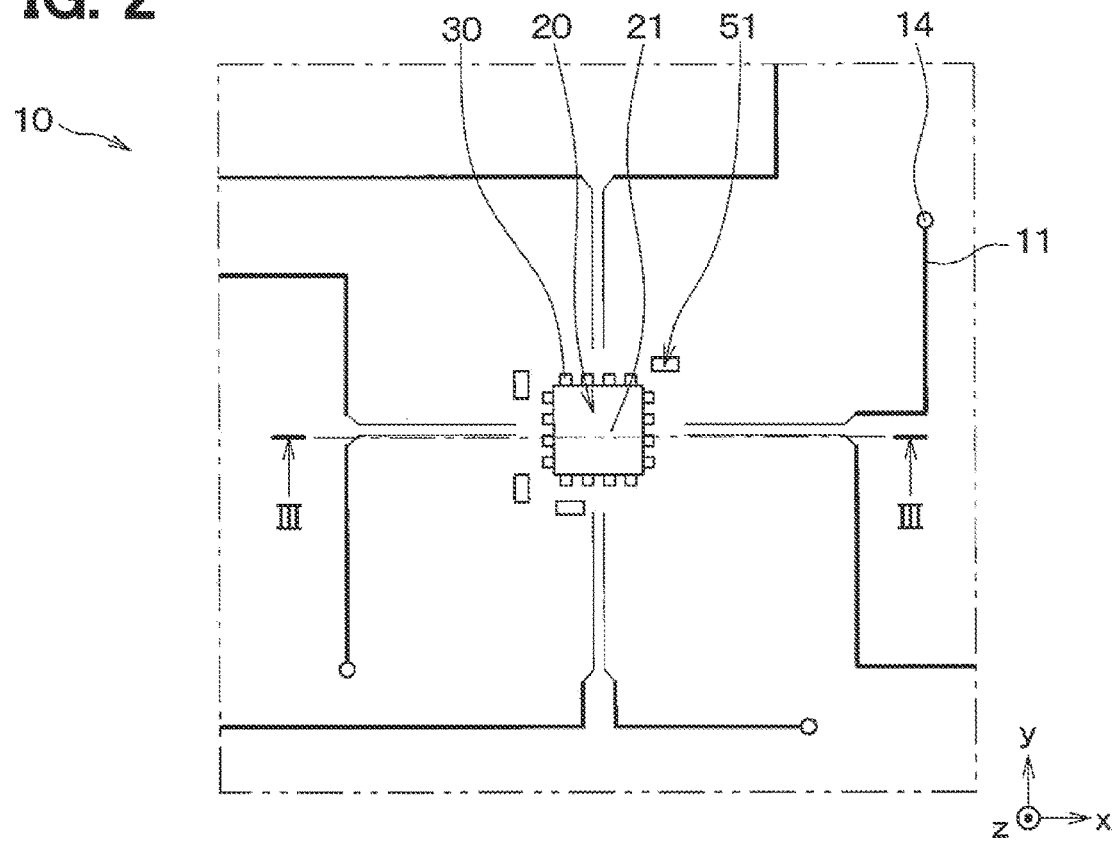
FIG. 2 is an enlarged view of a part II in FIG. 1.
Figure 3:
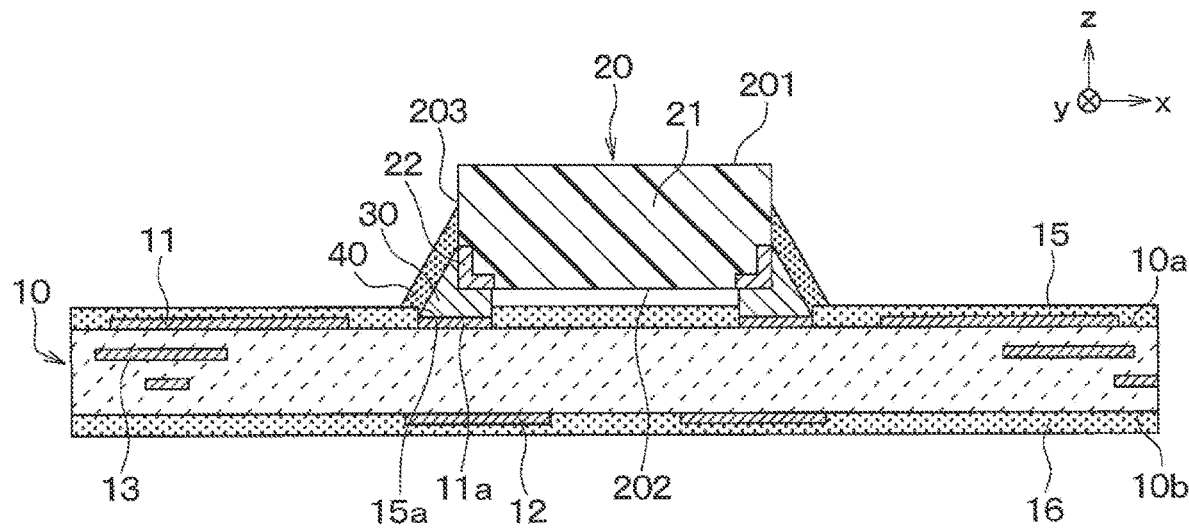
FIG. 3 is a cross-sectional view taken along a line III-III shown in FIG. 2.

As shown in FIGS. 1 to 3, the electronic device includes a printed board 10 and an electronic component 20 arranged on the printed board 10. The printed board 10 corresponds to a member on which the electronic component 20 is mounted, and will also be referred to as a mounting member for mounting the electronic component 20 thereon. In FIG. 2, for easy understanding, illustration of an insulating film 15 and sidefill 40, which will be described later, are omitted, and a wiring pattern 11 and the like covered with the insulating film 15 are illustrated with solid lines. In FIG. 3, a cross-sectional structure of the electronic component 20 is shown in a simplified manner. In the following description, a direction along a surface of the printed board 10, that is, one planar direction of the printed board 10 is defined as an x-axis direction, and a direction perpendicular to the x-axis direction along the surface of the printed board 10 is defined as a y-axis direction. Further, a direction perpendicular to both of the x-axis direction and the y-axis direction is defined as a z-axis direction.

The printed board 10 of the present embodiment is a multi-layer wiring board having a first surface 10a and a second surface 10b, and including a wiring pattern 11 and a land 11a connected to the wiring pattern 11 adjacent to the first surface 10a, a wiring pattern 12 adjacent to the second surface 10b, and a wiring layer 13 therein. The wiring pattern 11 adjacent to the first surface 10a, the wiring pattern 12 adjacent to the second surface 10b, and the inner wiring layer 13 are connected through one or more vias 14 in an appropriate manner. Such a printed board 10 is configured by using, for example, a glass epoxy board or the like.

Further, the printed board 10 has an insulating film 15 adjacent to the first surface 10a, and an insulating film 16 adjacent to the second surface 10b. The insulating films 15 and 16 are each made of a solder resist or the like. The insulating film 15 adjacent to the first surface 10a is formed with a contact hole 15a for exposing the land 11a to be connected to the electronic component 20.

Note that, in FIG. 2, illustration of the wiring pattern 11 that is formed on a periphery of the electronic component 20 when viewed in a direction normal to the planar direction of the printed board 10 (i.e., in the z-axis direction) is omitted. In an actual device, the wiring pattern 11 is formed so as to be connected to the land 11a to which the electronic component 20 is connected.

In the present embodiment, the electronic component 20 is configured to include an inertial force sensor that detects an inertial force. Specifically, the electronic component 20 includes an acceleration sensor that detects an acceleration along the x-axis direction, an acceleration sensor that detects an acceleration along the y-axis direction, and an acceleration sensor that detects an acceleration along the z-axis direction. Further, in the present embodiment, the electronic component 20 includes an angular velocity sensor that detects an angular velocity around the x-axis direction, an angular velocity sensor that detects an angular velocity around the y-axis direction, and an angular velocity sensor that detects an angular velocity around the z-axis direction. That is, the electronic component 20 of the present embodiment is a so-called IMU.

Although the specific configuration of the electronic component 20 of the present embodiment is omitted, the electronic component 20 is a QFN, and the acceleration sensors and the angular velocity sensors are housed in a case 21. The case 21 has a rectangular parallelepiped outer shape. The case 21 has a first surface 201, a second surface 202 opposite to the first surface 201, and four side surfaces 203 connecting between the first surface 201 and the second surface 202. The rectangular parallelepiped shape includes a cube shape. The rectangular parallelepiped shape may have a slight curvature or rounded portion at a corner portion that is an intersection between the first surface 201 and the two adjacent side surfaces 203, or a corner portion that is an intersection between the second surface 202 and the two adjacent side surfaces 203. Further, the case 21 is formed with a plurality of electrodes 22 on a plane including the second surface 202, and the electrodes 22 are electrically connected to the acceleration sensors and the angular velocity sensors housed in the case 21. In the present embodiment, the plurality of electrodes 22 are formed so as to extend from the respective side surfaces 203 to the second surface 202.

Each of the electrodes 22 of the electronic component 20 is electrically and mechanically connected to a corresponding land 11a on the printed board 10 through a solder 30. In the present embodiment, the electronic component 20 is arranged so that each side surface 203 is parallel to either the x-axis direction or the y-axis direction.

The sidefill 40 is arranged on a periphery of the solder 30 so as to mechanically connect between the printed board 10 and the electronic component 20. The sidefill 40 is made of an epoxy-based resin. That is, the electronic component 20 is mechanically connected to the printed board 10 via the solder 30 and the sidefill 40.

Figure 4:
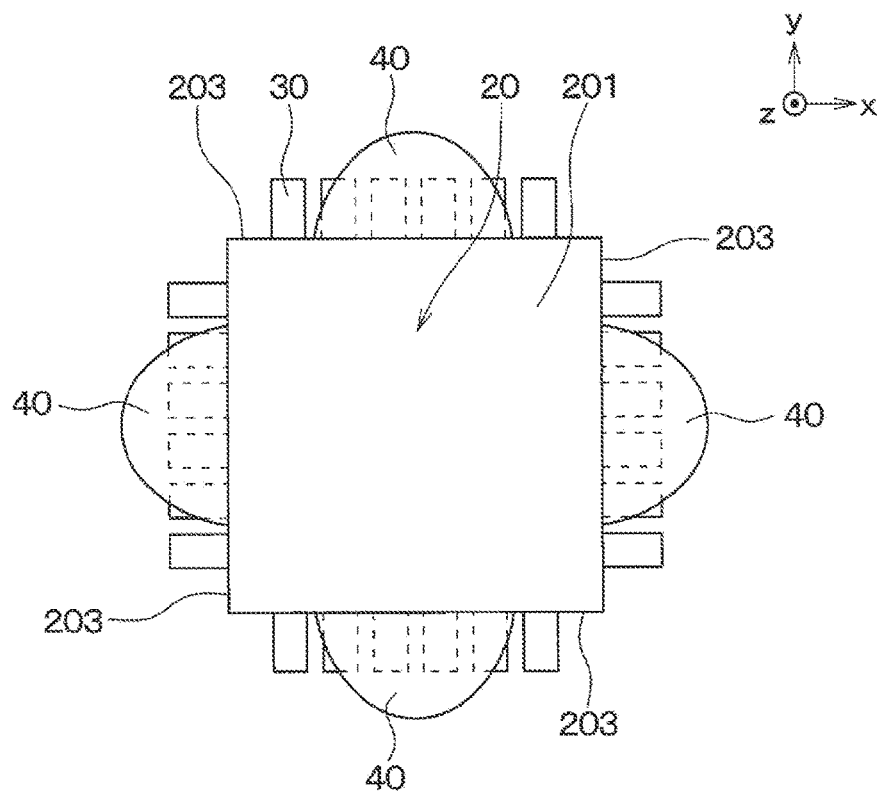
FIG. 4 is an enlarged plan view of an electronic component and a periphery of the electronic component.
Figure 5:
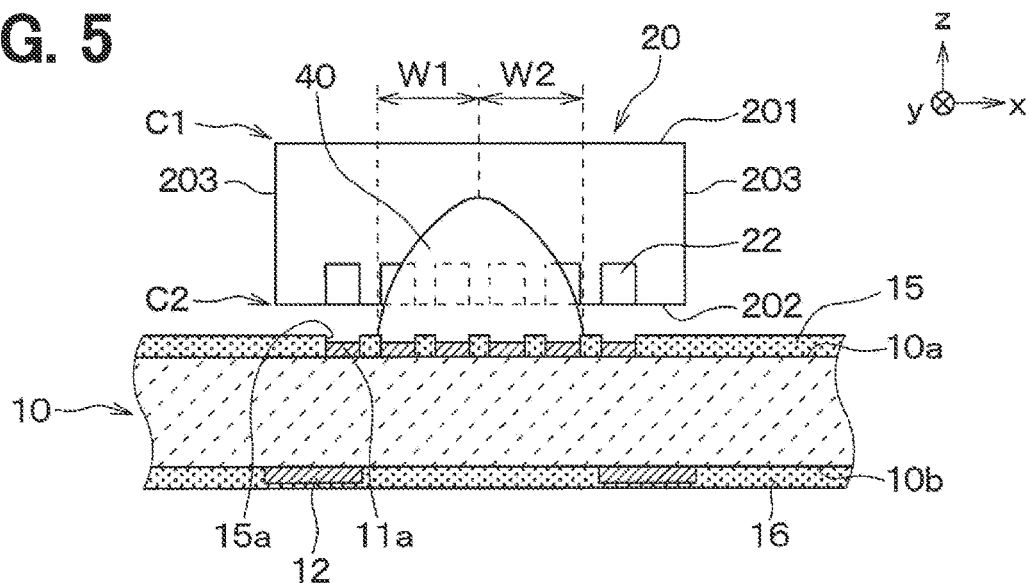
FIG. 5 is a schematic view of the electronic component when viewed in a direction normal to a side surface of the electronic component.

Hereinafter, the sidefill 40 of the present embodiment will be described in detail with reference to FIGS. 3 to 5. Note that FIG. 5 is a schematic view when the electronic component 20 is viewed along a direction normal to one of the side surfaces 203 of the electronic component 20, and in which the printed board 10 is shown in a cross-section defined along the one of the side surfaces 203. Further, in FIG. 5, illustration of the solders 30 arranged between the electrodes 22 and the lands 11a is omitted.

In the present embodiment, four sidefills 40 are arranged so as to be mechanically connected to the respective side surfaces 203 of the electronic component 20 when viewed in the z-axis direction. The four sidefills 40 are arranged apart from each other. In the present embodiment, the electronic component 20 has six electrodes 22 on each side surface 203, and each electrode 22 extends over from the side surface 203 to the second surface 202. The solder 30 is arranged so as to be connected to each electrode 22. In the following, a direction on the side surface 203 along the planar direction of the first surface 10a of the printed board 10 is referred to as a width direction. In other words, the width direction is a direction along a boundary line between the side surface 203 and the first surface 201 or the second surface 202. The width direction corresponds to a left and right direction in FIG. 5. In the present embodiment, the sidefill 40 is disposed to as to expose the solders 30 that are connected to the electrodes 22 at both ends in the width direction, and so as to cover the solders 30 that are connected to the electrodes 22 on an inner side in the width direction. The sidefill 40 is located in an area between the solders 30 that are connected to the electrodes 22 at opposite ends in the width direction.

Further, the sidefill 40 is arranged so as to spread in the width direction when viewed in the direction normal to the side surface 203 of the case 21. The sidefill 40 has a mountain-like shape in which the height from the printed board 10 (hereinafter, also simply referred to as the height) decreases from the inner side toward the opposite ends along the width direction. In the present embodiment, as shown in FIG. 5, the sidefill 40 has a shape in which a dimension w1 from the highest position to one end in the width direction and a dimension w2 from the highest position to the opposite end in the width direction are equal to each other, when viewed in the direction normal to the side surface 203. That is, the height of the sidefill 40 is maximum at the center in the width direction. However, the dimension w1 and the dimension w2 of the sidefill 40 may be different. That is, the sidefill 40 may have a shape in which the height is maximum at a position different from the center in the width direction.

The sidefills 40 are arranged so as to be point-symmetrical with respect to the center of the electronic component 20. Further, the sidefills 40 are arranged so as to be line-symmetrical with respect to a virtual line passing through the center of the electronic component 20 in the x-axis direction, and to be line-symmetrical with respect to a virtual line passing through the center of the electronic component 20 in the y-axis direction.

The sidefills 40 are arranged so that corner portions C1 of the electronic component 20 on an opposite side to the printed board 10, that is, on a side away from the printed board 10 (hereinafter, simply referred to as the upper end corner portions) are exposed from the sidefills 40. In the present embodiment, each sidefill 40 connected to the corresponding side surface 203 is arranged so as to expose the solders 30 connected to the electrodes 22 at opposite ends in the width direction as described above. Further, the sidefill 40 is arranged so that corner portions C2 of the electronic component 20 on the side adjacent to the printed board 10 (hereinafter, simply referred to as the lower end corner portions) are also exposed. In this case, the upper end corner portion C1 can be regarded as an intersection between the first surface 201 and the two adjacent side surfaces 203. Likewise, the lower end corner portion C2 can be regarded as an intersection between the second surface 202 and the two adjacent side surfaces 203.

The sidefills 40 of the present embodiment has the configurations as described above.

As shown in FIGS. 1 and 2, an external electronic component 51 such as a chip resistor or a chip capacitor, a microcomputer 52, a GNSS component 53, and a socket 54 for connection with other circuit units are mounted on the printed board 10. Further, the printed board 10 is formed with screw holes 17 or the like on an outer edge portion to receive screws for fixing the printed board 10 to a housing. The housing is, for example, made of an aluminum alloy or the like.

The electronic device of the present embodiment has the configurations as described above. Such an electronic device constitutes an in-vehicle device, for example, when the printed board 10 is screw-fixed to the housing through the screws inserted into the screw holes 17 of the printed board 10 and a metallic cover is placed on the housing so as to cover the electronic device. The in-vehicle device is mounted in a vehicle by mechanically fixing the housing, and is used for executing various controls of the vehicle. In the electronic device, the printed board 10 is likely to be warped when the electronic device is fixed to the housing or when the in-vehicle device is mounted on the vehicle after being fabricated. That is, in the electronic device of the present embodiment, the electronic component 20 is arranged on the printed board 10, which might be deformed.

According to the present embodiment described above, since the sidefills 40 for mechanically connecting the printed board 10 and the electronic component 20 are arranged, it is possible to extend the life of the solder 30.

The sidefills 40 are arranged so as to expose the upper end corner portions C1 of the electronic component 20. Therefore, as compared with a case where the upper end corner portions C1 of the electronic component 20 are covered with the sidefills 40, even if the printed board 10 is warped or the like, it is possible to suppress the stress generated at the upper end corner portions C1 of the electronic component 20 from increasing, and to suppress the moment generated in the electronic component 20 from increasing. According, it is possible to suppress the occurrence of defects in electronic component.

In particular, in the present embodiment, the electronic component 20 is an IMU. If the moment generated in the electronic component 20 is large, defects such as zero-point fluctuation and axis misalignment are likely to easily occur. In the present embodiment, since the sidefills 40 are arranged as described above, it is possible to suppress the occurrence of defects such as zero-point fluctuation and axis misalignment. That is, according to the electronic device of the present embodiment, the robustness of the electronic component 20 can be improved, and the deterioration of the detection accuracy of the IMU can be suppressed. Further, since the zero-point fluctuation is unlikely to occur in the electronic component 20, it is not necessary to perform a zero-point correction after fabrication of the electronic device, and thus costs required for the adjustment and the inspection can be reduced.

Further, each sidefill 40 has a mountain-like shape in which the height decreases from the inner side toward the ends along the width direction. In other words, the height of the sidefill 40 at the ends in the width direction is smaller than that on the inner side in the width direction. Therefore, it is not necessary to strictly control the shape of the sidefill 40, for example, as compared with the case where the height of the sidefill 40 is constant along the width direction. As such, the manufacturing process can be simplified.

The sidefills 40 are arranged to be point-symmetrical with respect to the center of the electronic component 20. The sidefills 40 are arranged to be line-symmetrical with respect to the virtual line passing through the center of the electronic component 20 in the x-axis direction, and to be line-symmetrical with respect to the virtual line passing through the center of the electronic component 20 in the y-axis direction. Therefore, the stress propagated to the electronic component 20 from the sidefills 40 can be easily equalized. In other words, the stress due to the sidefills 40 can be easily balanced. Accordingly, it is possible to further suppress the occurrence of defects in the electronic component 20.

In the electronic device of the present embodiment, as described above, the electronic component 20 is the IMU, and is used to provide a self-position estimation system. As described above, since the axis misalignment is suppressed and the occurrence of the zero-point fluctuation is suppressed, the electronic component 20 is in a condition where the inertial forces along the six axes can be detected with high accuracy. Therefore, the electronic device of the present embodiment can provide dead reckoning (that is, inertial navigation) of the vehicle for a long period of time.

Since the sidefills 40 are arranged in the manner described above, the life of the solder 30 can be extended. However, by arranging the sidefills 40, the portions mechanically connecting between the printed board 10 and the electronic component 20 increase. For example, if the printed board 10 is warped, the stress propagated from the printed board 10 to the electronic component 20 increases.

Figure 6:
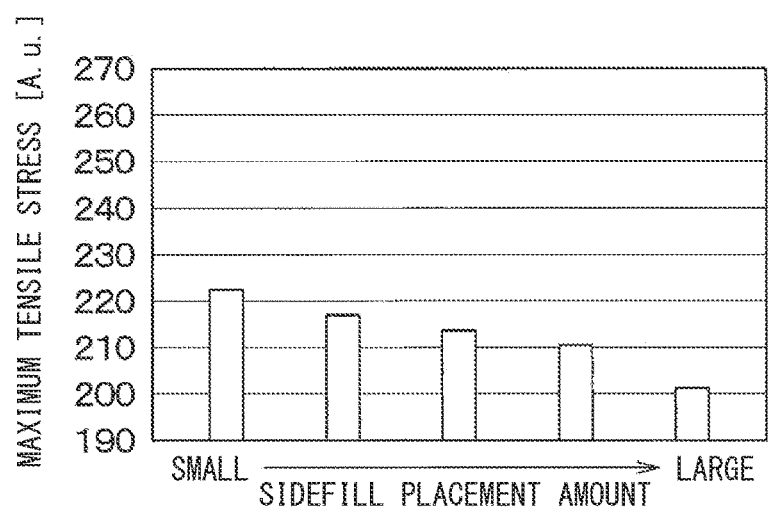
FIG. 6 is a diagram showing the relationship between the placement amount of sidefill and the maximum tensile stress applied to solder.

Specifically, as shown in FIG. 6, as the placement amount of the sidefill 40 increases, the stress dispersed in the sidefill 40 increases, so that the maximum tensile stress applied to the solder 30 decreases. Therefore, the life of the solder 30 can be more extended with the increase of the placement amount of the sidefill 40. The placement amount of the sidefill 40 means the amount of portion that mechanically connects between the printed board 10 and the electronic component 20. Further, the increase of the placement amount of the sidefill 40 means the increase in the portion mechanically connecting between the printed board 10 and the electronic component 20.

Figure 7:
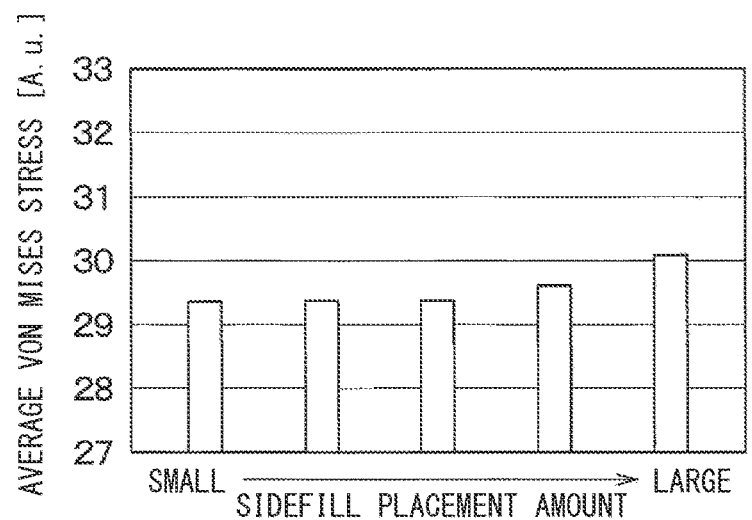
FIG. 7 is a diagram showing the relationship between the placement amount of the sidefill and the average von Mises stress applied to the electronic component.

On the other hand, as shown in FIG. 7, as the placement amount of the sidefill 40 increases, the stress is more likely to be propagated from the printed board 10 to the electronic component 20 via the sidefills 40, so that the average von Mises stress applied to the electronic component 20 increases. Therefore, it is preferable that the sidefills 40 have the above configuration and the placement amount is determined according to the application or usage.

Modifications of First Embodiment

Figure 8A:
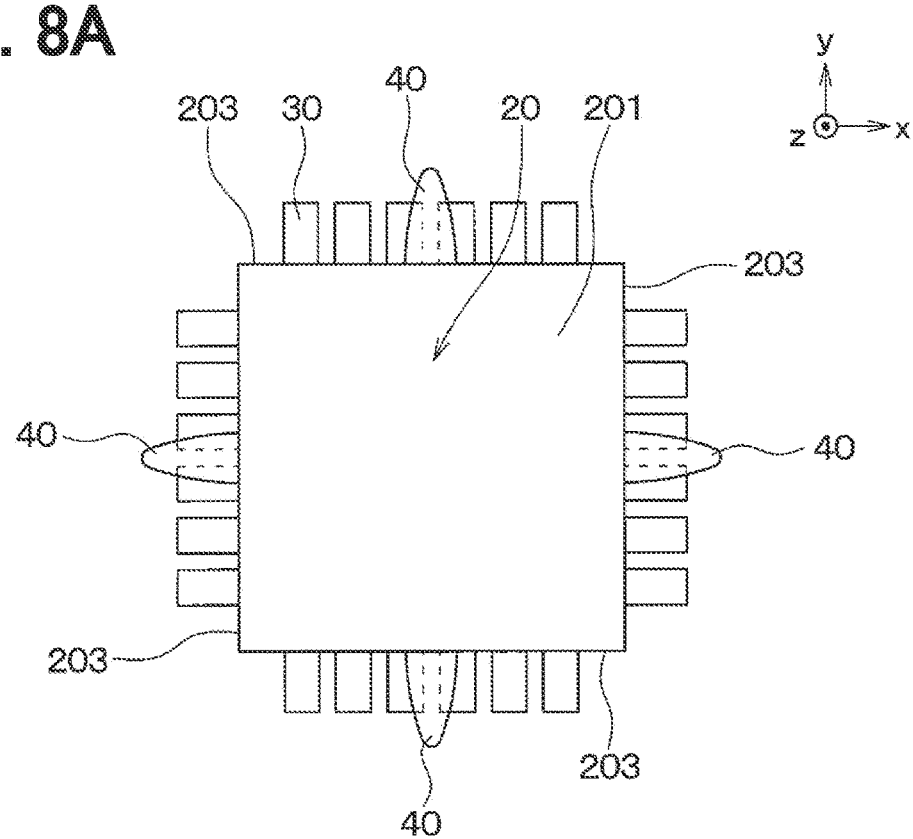
FIG. 8A is a schematic enlarged plan view of an electronic component and a periphery of the electronic component of a modification of the first embodiment.
Figure 8B:
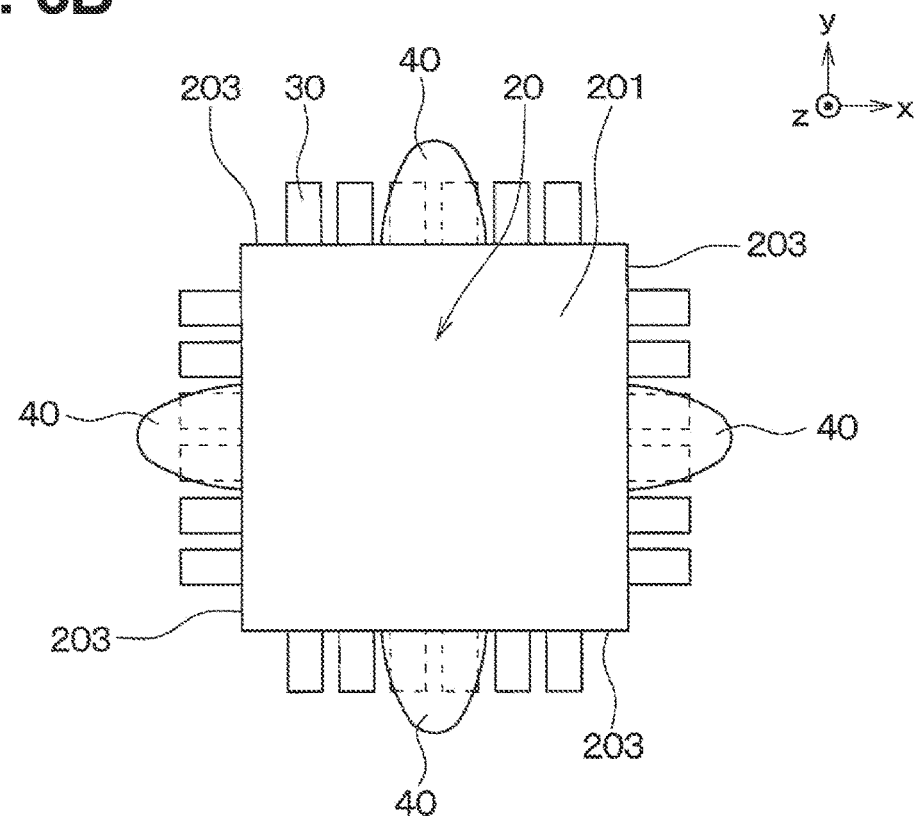
FIG. 8B is a schematic enlarged plan view of an electronic component and a periphery of the electronic component of a modification of the first embodiment.
Figure 8C:
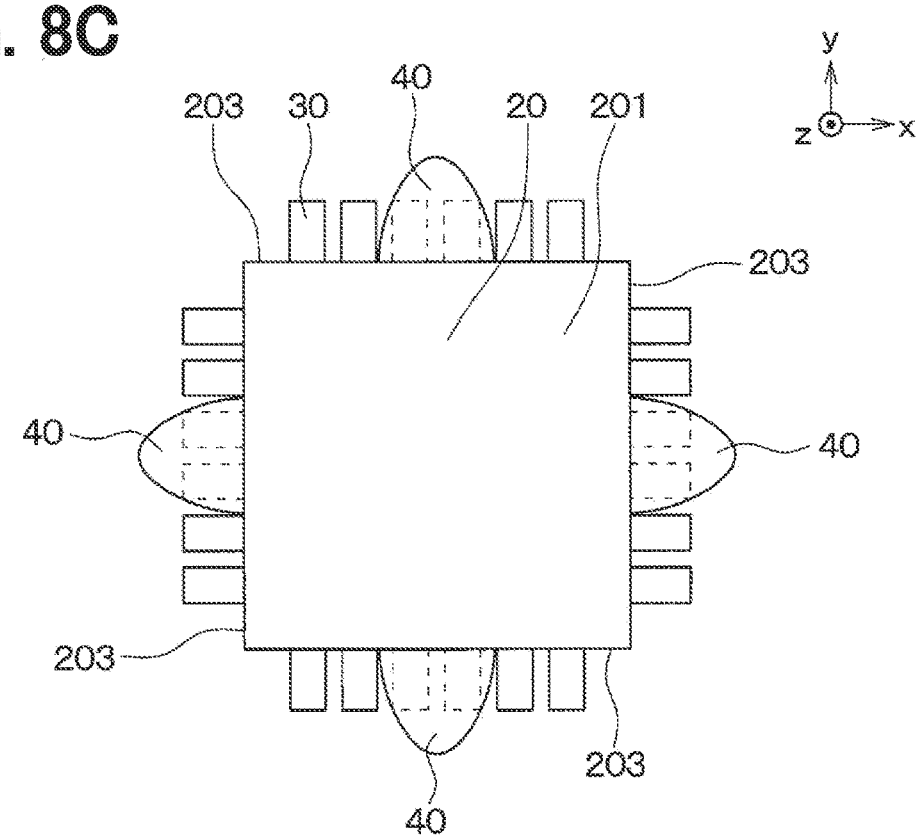
FIG. 8C is a schematic enlarged plan view of an electronic component and a periphery of the electronic component of a modification of the first embodiment.
Figure 8D:
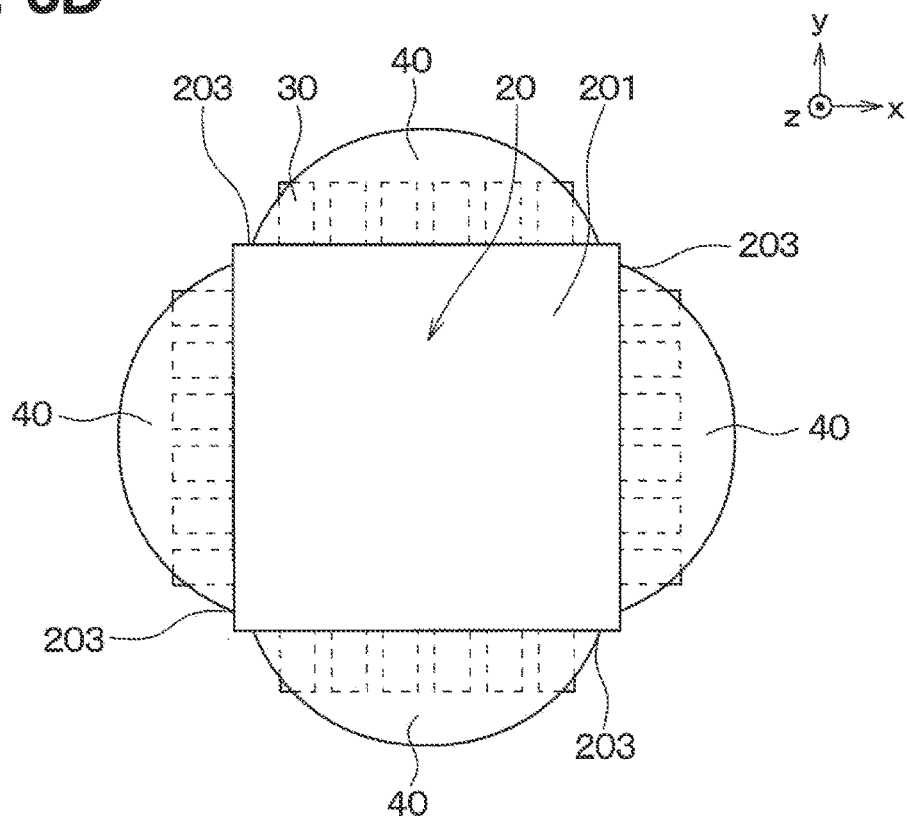
FIG. 8D is a schematic enlarged plan view of an electronic component and a periphery of the electronic component of a modification of the first embodiment.

In the first embodiment, the shape of the sidefill 40 can be changed as appropriate. For example, each sidefill 40 may be arranged as shown in FIGS. 8A to 8C. That is, the sidefill 40 may be arranged so as to cover the solders 30 connected to two inner electrodes 22 in the width direction while exposing the solders 30 connected to the two end electrodes 22 at the opposite ends in the width direction, when viewed in the direction normal to the printed board 10. In this case, as shown in FIGS. 8A to 8C, the dimension or width of the sidefill 40 in the width direction can be appropriately changed. Although not particularly shown, a part of the electrodes 22 of the electronic component 20 may not be electrically connected to the inertial force sensor housed in the case 21. In such a case, the sidefill 40 may be arranged so as to expose the solder 30 connected to the electrode 22 that is not electrically connected to the inertial force sensor. That is, the sidefill 40 may be arranged so as to expose the solder 30 which does not affect the electrical connection between the electronic component 20 and the printed board 10 even if the solder 30 is damaged. Further, as shown in FIG. 8D, each sidefill 40 may be arranged so as to cover all the solders 30 connected to the respective electrodes 22.

Figure 9A:
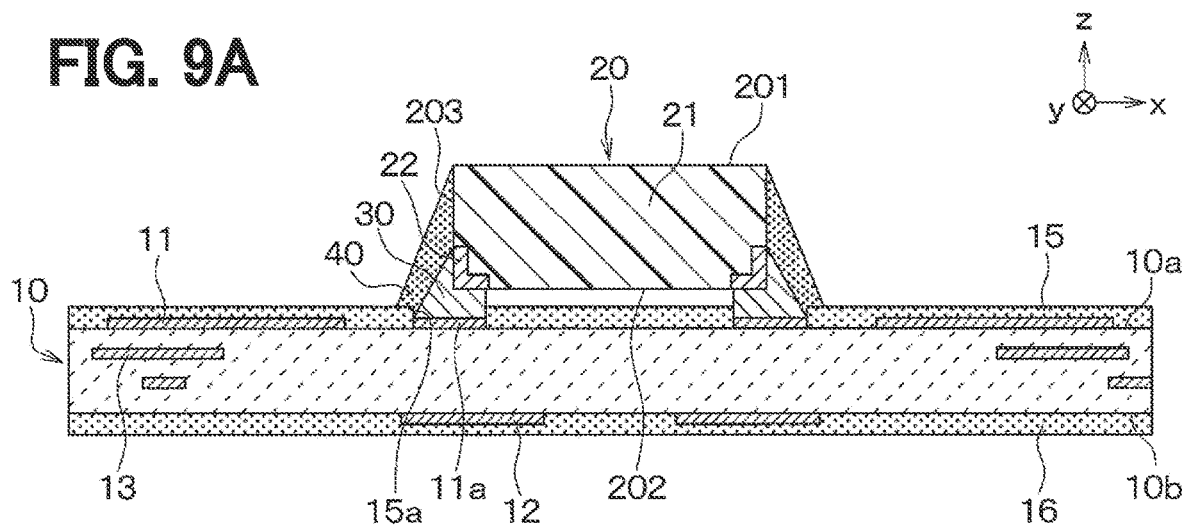
FIG. 9A is a cross-sectional view of an electronic component and a periphery of the electronic component of a modification of the first embodiment.
Figure 9B:
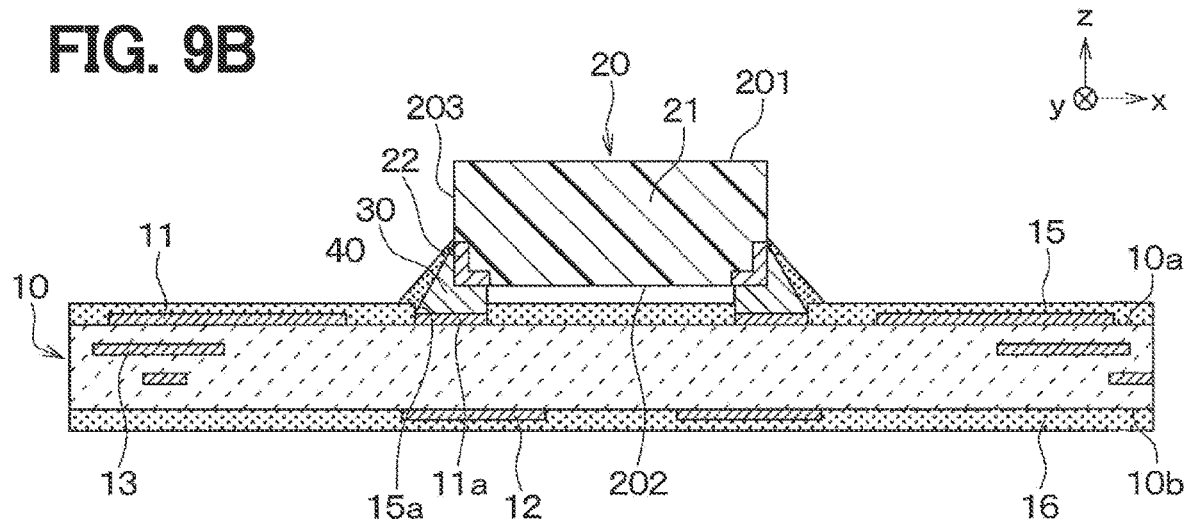
FIG. 9B is a cross-sectional view of an electronic component and a periphery of the electronic component of a modification of the first embodiment.
Figure 9C:
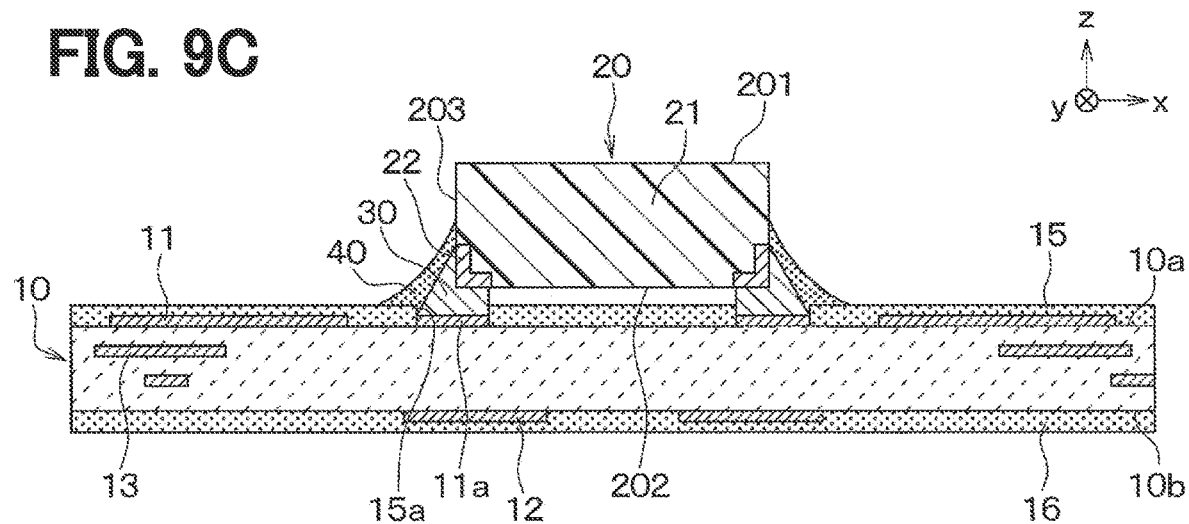
FIG. 9C is a cross-sectional view of an electronic component and a periphery of the electronic component of a modification of the first embodiment.

Further, the maximum height of each sidefill 40 can be appropriately changed. For example, as shown in FIG. 9A, the sidefill 40 may be formed to have the height reaching the first surface 201. As another example, as shown in FIG. 9B, the sidefill 40 may have substantially the same height as the solder 30. As further another example, as shown in FIG. 9C, the outer surface of the sidefill 40 may be curved, instead of being flat, that is linear in a cross-section. Note that FIGS. 9A to 9C are cross-sectional views taken along the line III-III in FIG. 2.

Second Embodiment

A second embodiment will be described. In the present embodiment, the shape of the sidefill 40 is different from that of the first embodiment. The other configurations of the present embodiment are the same as those of the first embodiment, and therefore a description of the same configurations will be omitted hereinafter.

Figure 10:
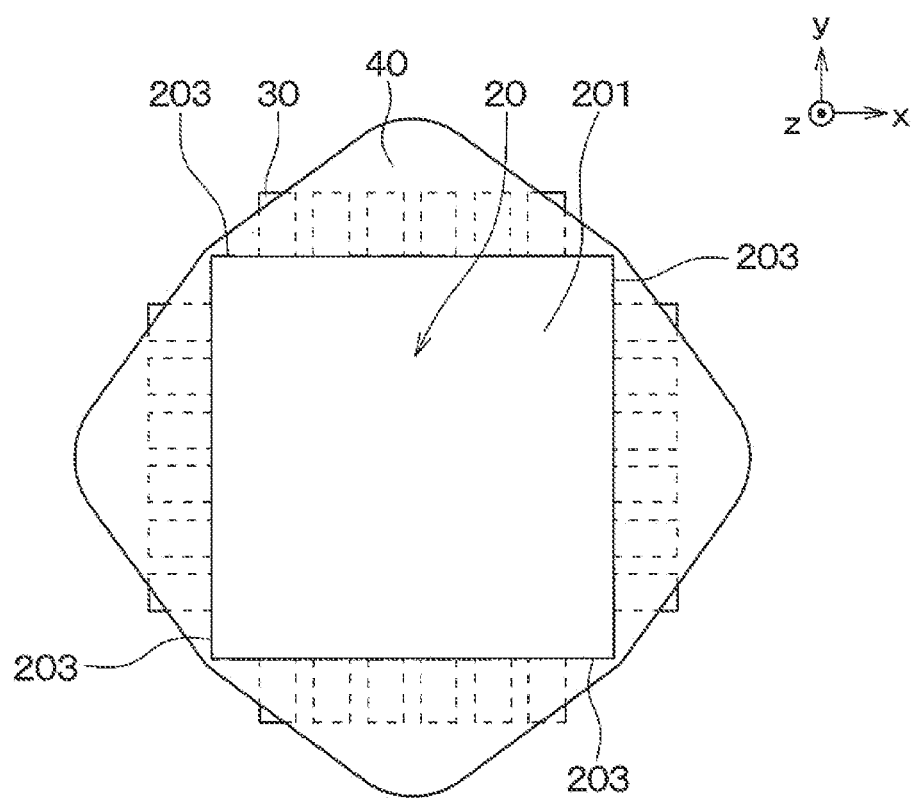
FIG. 10 is a schematic plan view of an electronic component and a periphery of the electronic component according to a second embodiment.

In the present embodiment, as shown in FIG. 10, the sidefills 40 are arranged so that the portions disposed on the side surfaces 203 of the case 21 are connected to each other. In this case, the portions of the sidefills 40 disposed on the side surfaces 203 of the case 21 are connected to each other in the vicinity of the lower end corner portions C2 of the electronic component 20, and the upper end corner portions C1 of the electronic component 20 are not covered with the sidefills 40, that is, exposed from the sidefills 40. In the present embodiment, the lower end corner portions C2 of the electronic component 20 may be covered with the sidefills 40 or may be exposed from the sidefills 40.

According to the present embodiment described above, the sidefills 40 are connected to each other through the portions disposed on the side surfaces 203 of the case 21. Therefore, detailed control for separating the sidefills 40 disposed on the side surface 203 of the case 21 is not necessary, and the manufacturing process can be simplified.

Other Embodiments

Although the present disclosure has been described in accordance with the embodiments, it is understood that the present disclosure is not limited to such embodiments or structures. The present disclosure encompasses various modifications and variations within the scope of equivalents. Furthermore, various combinations and modes, and other combination and modes including only one, more or less element, fall within the spirit and scope of the present disclosure.

For example, in each of the embodiments described above, the printed board 10 as the mounting member may be provided by ceramic board or the like, instead of the glass epoxy board.

In each of the embodiments described above, the electronic component 20 may not have three acceleration sensors and three angular velocity sensors. For example, the electronic component 20 may be configured to have two or less acceleration sensors, or to have two or less angular velocity sensors. As another example, the electronic component 20 may be configured to only have an acceleration sensor or to only have an angular velocity sensor. As further another example, the electronic component 20 may be configured to have a physical quantity sensor that detects a physical quantity different from acceleration and angular velocity. In such a case, the electronic component 20 may be configured to have only such a physical quantity sensor, or may be configured to have such a physical quantity sensor and at least one of the acceleration sensor and the angular velocity sensor. Alternatively, the electronic component 20 may have a configuration in which a capacitor or a resistor is provided, without including a sensor for detecting a physical quantity such as an acceleration or an angular velocity.

In each of the embodiments described above, the electronic component 20 may not be limited to the QFN as long as the electrodes 22 are arranged on the plane including the second surface 202. For example, the electronic component 20 may include a small outline non-leaded package (SON), a very-thin small outline non-leaded package (VSON), a thin-quad flat no-lead plastic package (TQFN), a leaded chip carrier (LCC), a ceramic leaded chip carrier (CLCC), a dual flat package (DFN), a quad flat i-leaded package (QFI), a ball grid array (BGA), an enhanced ball grid array (EBGA), a flex tape ball grid array (FTBGA), a thin and fine-pitch ball grid array (TFBGA) or the like.

In each of the embodiments described above, the sidefills 40 may be arranged to have either a point-symmetrical arrangement or a line-symmetrical arrangement. In a case of the line-symmetrical arrangement, the sidefills 40 may be arranged to be line-symmetrical with respect to either the virtual line extending in the x-axis direction or the virtual line extending in the y-axis direction. Alternatively, the sidefills 40 may not be arranged to be point-symmetrical and line-symmetrical.

In each of the embodiments described above, an underfill may be arranged between the printed board 10 and the second surface 202 of the electronic component 20.

What is claimed is:

1. An electronic device comprising:
a mounting member having a surface;
an electronic component mounted on the surface of the mounting member, the electronic component having a rectangular parallelepiped outer shape including a first surface, a second surface opposite to the first surface, and four sides surfaces connecting between the first surface and the second surface, the electronic component including a plurality of electrodes on the second surface that faces the surface of the mounting member;
a solder disposed between the mounting member and each of the electrodes of the electronic component, and electrically and mechanically connecting between the mounting member and each of the electrodes; and
a sidefill disposed on a periphery of the solder, and mechanically connecting between the electronic component and the mounting member, wherein
the sidefill is disposed on each of the four side surfaces of the electronic component at least in a region adjacent to the second surface of the electronic component while exposing a corner portion of the electronic component on a side opposite to the mounting member,
the sidefill has a height from the surface of the mounting member, and the height of the sidefill in an area within a width of a corresponding one of the four side surfaces is smaller at opposite ends in a width direction than on an inner side in the width direction, the width direction being a direction on the corresponding one of the four side surfaces and along the surface of the mounting member,
on the second surface of the electronic component, the plurality of electrodes are disposed only along an outer edge of the second surface,
the plurality of electrodes are disposed to extend from the second surface to the side surfaces over corner portions defined between the second surfaces and the side surfaces,
the sidefill is absent in an area inside the plurality of electrodes on the second surface of the electronic component,
the second surface of the electronic component in the area inside the plurality of electrodes is exposed from the solder and the sidefill,
the solder is provided at a plurality of locations corresponding to the plurality of electrodes, and the solder provided at each of the plurality of locations covers a corresponding one of the electrodes on the second surface and the corresponding one of the four side surfaces,
on each of the four side surfaces, the sidefill is disposed to cover at least two of a plurality of the solders and to expose at least part of the plurality of the solders located at ends in the width direction,
the electronic component is an inertial measurement unit (IMU) including an inertial force sensor configured to detect an inertial force,
a plurality of the sidefills are arranged so as to be mechanically connected to the four side surfaces of the electronic component, and
portions of the plurality of the sidefills mechanically connected to the four side surfaces are connected to each other.

2. The electronic device according to claim 1, wherein a plurality of the sidefills are arranged to be at least one of point-symmetry with respect to a center of the electronic component and line-symmetry with respect to a virtual line passing through the center of the electronic component.

3. The electronic device according to claim 1, wherein the sidefill has a thickness in a direction orthogonal to the at least one of the four side surfaces, and
the thickness of the sidefill in the area within the width of the at least one of the four side surfaces is smaller at the opposite ends than on the inner side in the width direction.

4. The electronic device according to claim 1, wherein an outer surface of the sidefill is flat so as to be linear in a cross section view.

5. The electronic device according to claim 1, wherein an outer surface of the sidefill is curved so as to be concave in a cross section view.

6. The electronic device according to claim 1, wherein on each of the four side surfaces, the sidefill further is disposed to expose both lower corner portions of the electronic component, the lower corner portions being on a side adjacent to the mounting member.

\* \* \* \* \*